(12) United States Patent
Carro

(10) Patent No.: US 6,515,504 B1
(45) Date of Patent: Feb. 4, 2003

(54) CIRCUITS AND METHOD FOR IMPLEMENTING AUTONOMOUS SEQUENTIAL LOGIC

(75) Inventor: Fernando Incertis Carro, Valencia (ES)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/454,953

(22) Filed: Dec. 3, 1999

(30) Foreign Application Priority Data

Dec. 29, 1998 (EP) .............................................. 98480106

(51) Int. Cl.[7] .......................................... H03K 19/177
(52) U.S. Cl. .............................. 326/37; 326/40; 326/46; 326/93
(58) Field of Search ................................ 326/37, 40, 46

(56) References Cited

U.S. PATENT DOCUMENTS

| | | |
|---|---|---|
| 5,289,403 A | 2/1994 | Yetter |
| 5,387,825 A | 2/1995 | Cantrell et al. |
| 5,394,407 A | 2/1995 | Coddington |
| 5,565,798 A | 10/1996 | Durham et al. |
| 5,574,940 A | 11/1996 | Otsuka |
| 5,724,537 A | 3/1998 | Jones |
| 5,870,411 A * | 2/1999 | Durham et al. ............. 371/22.5 |
| 6,133,758 A * | 10/2000 | Durham et al. ................. 326/93 |
| 6,169,422 B1 * | 1/2001 | Harris et al. .................... 326/98 |
| 6,229,746 B1 * | 5/2001 | Tooher .......................... 365/210 |

FOREIGN PATENT DOCUMENTS

EP      0 390 309      1/1990

* cited by examiner

Primary Examiner—Michael Tokar
Assistant Examiner—Vibol Tan

(57) ABSTRACT

In a data processing system, a circuit and methods for carrying out sequential logic functions are disclosed aimed at overcoming the problems encountered with the standard approach for designing synchronous logic, timed from a single clock source. When propagation delays through logic elements and their interconnections are becoming of the same order of magnitude as the clock period necessary to achieve the required level of performance of a logic function, the distribution of a common timing reference or clock over an entire function is becoming the limiting factor. In a complete departure from the standard approach, logic functions of the invention are capable of supplying their own timing information to their interface thus, self asserting their result and capable of requesting new set of inputs when needed. Therefore, logic functions of the invention are autonomous and do not rely on the distribution of a clock to operate.

16 Claims, 7 Drawing Sheets

CIRCUITS AND METHOD FOR IMPLEMENTING AUTONOMOUS SEQUENTIAL LOGIC

FIELD OF THE INVENTION

The present invention relates generally to data processing units and more particularly to a circuit and methods for implementing sequential logic functions from autonomous, i.e., clock-less, self-validating circuits.

BACKGROUND OF THE INVENTION

The traditional way of implementing logic functions has been, for decades now, to have pure combinational boolean logic inserted-between banks of binary storage devices, i.e., latches or flip-flops controlled from a single free-running signal referred to as the clock that sets the pace at which the whole logic function is operating. In this standard approach all the combinational logic required for implementing a given logic function can be decomposed in cones of logic. Each cone having one-output and, in the general case, several inputs although anything between one input and many inputs is obviously possible. Then, each output of a cone feeds an input of a latch, updated at next occurrence of a clock transition thus, remembering the current output result of the cone until it is updated again at a subsequent transition of the clock. In turn, latch outputs are possible inputs to all other cones of logic (recursive feeding is possible and is a common practice especially, when a particular state must be maintained for several cycles of the clock) so as every cone input is stable for a complete clock cycle since every latch is holding its binary information for one clock cycle. As a consequence, state of the logic may only change with the clock and any logic function built according to these principles is orderly evolving since it is under the control of a common timing device.

This way of implementing logic functions has become a standard when their complexity has dramatically increased fueled by the progresses in the integration, on a single piece of silicon, of thousands and soon, of millions of transistors. Early logic circuits tended to be more sophisticated than the simple scheme herein above described. They were often characterized by the presence of several clocks, not necessarily running in synchronism, and even by logic supplying clocks to other pieces of logic. These approaches were very prone to errors and unpredictable results were observed depending on the relative speed of the components. Moreover, logic boards built with such logic devices were often not even completely testable after fabrication. Some defects could only be found within the machine they were put in it and sometimes only at customer premises that was the most expensive way of discovering bugs. Therefore, logic designs were structured, so as they could more easily be synthesized, simulated and tested leading to the simple approach to designing logic previously described.

However, this approach hinges on a crucial requirement which is that the clock speed must be set for the worst case paths, sometimes the only worst case path, found within the logic. Moreover, worst case paths must be considered for the worst case environmental conditions of temperature and power-supply in which a particular logic will have to operate. Finally, the characteristics of the worst case fabrication lot must also be considered to decide at which speed a particular device will possibly run. Because a particular logic is designed in view of accomplishing a given task, at a given level of performance, the speed at which clock must run is in fact the starting requirement. The designer is then faced to the problem of fitting the design into this requirement for the worst case conditions, herein above mentioned, even though they are seldom, not to say never, all simultaneously encountered. In fact, a very disturbing problem of the binary boolean type of logic, universally used as of now to implement combinational logic, is that there is no associated notion of completeness. It is not possible, just observing the output of a cone, to determine if the job has been carried out or not. In fact, often, output of a cone is glitching until the longest path of the cone has settled. As a consequence the result must be assumed based on the time that has elapsed since the last transition of the clock has occurred. In practice, this means that every path in every cone of a particular design must be analyzed so as to make sure that all cone outputs are stable before the next clock transition occurs. Indeed, checking programs have been designed which scrub all the possible paths, pinpointing the ones for which delays are exceeding the period of the clock even though some may not be functional! Then, it is up to the designer to decide if those paths are indeed functional and must be corrected through another round of physical design. This is a time consuming, expensive in terms of computing resources and cumbersome job that is not always successful if the clock period is too tight for the current technology available and the logic function too complex. A dead-end situation that may become obvious only long after the physical design process has started and that may require drastic actions like restarting from scratch with a brand new approach.

So, in an attempt to facilitate the physical design and make possible the actual implementation of a logic, often, the designer is pipe-lining the design. Which means that smaller chunks of logic are inserted between banks of latches so as the paths are becoming shorter. The price to pay for that is twofold. Firstly, the result of a pipe-lined logic function becomes available only after several cycles of the clock thus, increasing the latency. Secondly, latches must be inserted where logic function has been cut even though the intermediate results are generally of no interest and are useless for the rest of the logic. This brings another limitation of the current way of designing logic dealing with the fact that a clock timing has to be precisely distributed over a whole logic function, i.e., to every latch. It is particularly important that the clock distribution structure, often referred to as the clock tree, exhibits no skew between its various branches over the whole area covered by a logic function implemented on a semiconductor chip (most of the time silicon) or at least has a skew which is lower than the best case of the shortest path present on the chip so as it is not possible to experience any short-cut that would result of a latch feeding another one too soon because their respective clocks are enough skewed to allow propagation to occur on the same master clock transition. This is another headache for the logic designers although this part might be, at some extent, handled by the provider of the Gate Array (GA) or Field Programmable Gate Array (FPGA) generally used for the Application Specific Integrated Circuits (ASIC). In which cases considerable software and hardware resources are spent either during the physical design phase of any part or initially while the particular device was devised by the manufacturer to provide numerous repowering and the possibility of a load balancing between branches so as to keep skew at a minimum. Moreover, the clock tree in itself occupies a significant portion of a chip area and dissipates much power too because it is constantly toggled at the highest frequency present on the chip.

Still another problem of clocked designs is that everything is changing on the advent of a clock transition common to every latch that triggers peaks of current through the power supply terminals of the chips and modules thus, disturbing, among other things, the ground and which may jeopardize the noise immunity of the gates and latches if not contained through a careful design of the packaging at each level, i.e., chip, module and board so as to keep the parasitic inductances as low as possible.

A mention should also be made here of the electromagnetic emissions produced by the clocked designs that may create interferences to other pieces of equipment and that must be drastically controlled so as to conform with the EMC (ElectroMagnetic Compatibility) directives in effect.

In spite of all these drawbacks, because of its simplicity and of all advantages resulting of it, synchronous (clocked) type of design has been, by far, the standard for many years. Indeed, it was possible to cope with all above cited problems because the clock frequency was reasonably low. However, the relentless quest for performance has driven the clock frequency to values expressed in hundreds of megahertz for commercially available microprocessors and in Gigahertz for their laboratory counterparts. Obviously, these are internal, on chip, clock frequencies, that cannot be sustained at the periphery of the modules actually able to run only at frequencies one order of magnitude lower. To fix the ideas the light is traveling, in a perfect medium, 30 cm within a time period of 1 nanosecond, which corresponds to the clock period of the current laboratory parts while microprocessor chips are commonly square of 1.5×1.5 cm. Indeed, the speed limitation on the wires, a not so perfect medium, has become the limiting factor to increase the performance forcing the manufacturers to use very sophisticated technologies, very expensive in terms of investments, with many wiring layers (5 is becoming the standard) so as to shorten the distances and/or using materials of better electrical characteristics (copper is replacing aluminum although it was very difficult to accommodate its very undesirable secondary effects on silicium) in an attempt to reduce transmission delays.

It is therefore strongly believed that, in spite of its simplicity, and long proved capability to cope with an always increasing demand for performance, the simple synchronous (clocked) approach to designing logic functions does no longer fit well the performance requirements for the newest generations of microprocessors and ASIC's and that new approaches, which get rid of a centralized clocking, must be considered.

Thus, it is a broad object of the invention to overcome the problems of the synchronous, clocked, logic designs.

It is a further object of the invention to allow logic functions to be capable of self-assessing readiness, i.e., to indicate when they have completed the process of a new set of inputs.

It is another object of the invention to permit that logic functions, or combinations of, supply their own clocks.

It is still another object of the invention to have logic functions always operating at their maximum speed.

SUMMARY OF THE INVENTION

A logic circuit is disclosed that is operable in a DUMMY mode and in a VALID mode. It comprises a plurality of LOGIC input and output lines each having an asserted and a de-asserted state. It also comprises a plurality of MODE input lines, for turning the logic circuit into the herein above DUMMY or VALID modes along with a plurality of MODE output lines, for detecting whether the logic circuit is operating in the DUMMY or VALID mode. Logic operations are performed between the LOGIC input lines and the LOGIC output lines whenever the VALID mode is active while the DUMMY mode is permitted to propagate throughout the logic circuit regardless of whether the LOGIC input lines are in an asserted or a de-asserted state.

The logic circuit further comprises a MODE Control for turning the logic circuit into either one of the two herein above modes also, including a PACE signal that, when asserted, turns said logic circuit into the DUMMY mode and an input for a FEEDBACK signal for toggling between the VALID mode and the DUMMY mode when the PACE signal is not asserted along with an output for a FEEDFORWARD signal for reporting what mode controlling means is currently asserting.

The logic circuit still comprises a MODE Detect for detecting in which one of the two herein above modes the logic circuit is operating, including an input for the FEEDFORWARD signal just described and an output for the FEEDBACK signal reporting if the detecting means is currently detecting the VALID or the DUMMY mode along with a STATUS for generating a first signal for requesting the assertion of new states on the LOGIC inputs and a second signal for indicating that new states are ready to be used on the LOGIC outputs.

Methods for assembling herein above logic circuits forming serial, parallel or mixed combinations, working in synchronism, in a glitch-less manner, are also disclosed.

The circuit and methods of the invention permit to carry out sequential logic functions that do not require a common clock be distributed over a complete function, such as an ASIC or a Processor, to inter-operate.

DETAILED DESCRIPTION OF THE PREFERRED EMBODIMENT

Figure 1:
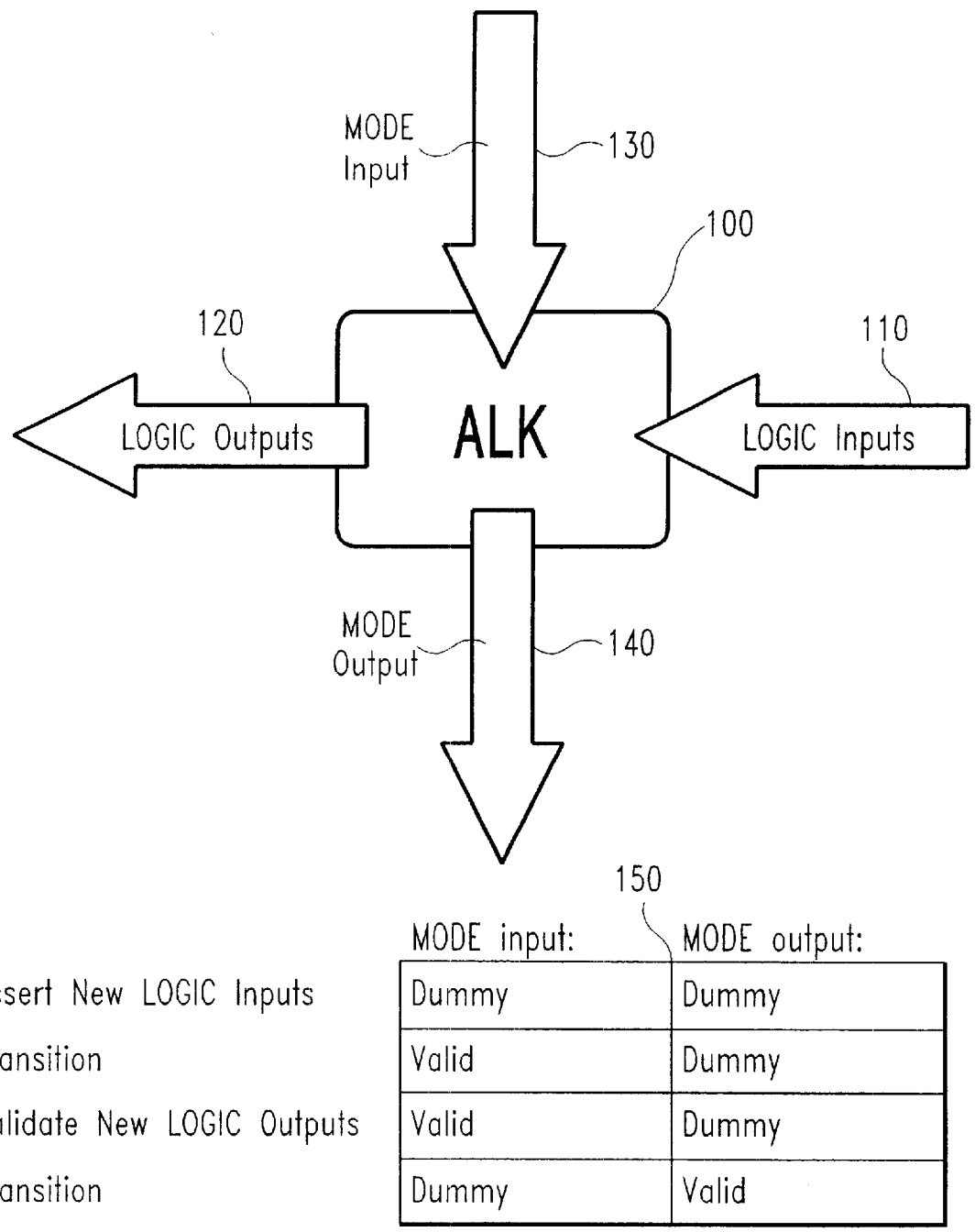
FIG. 1 illustrates the principles to which Autonomous Logic must obey.

FIG. 1 focuses on the principles to which the logic kernel, around which the Autonomous Logic Circuit or ALC is derived, must obey. The Autonomous Logic Kernel or ALK [100] has LOGIC inputs [110] and at least one LOGIC output [120] thus, performing a specific logic function. However, on an additional MODE input [130] of ALK, that may comprise a plurality of lines, a DUMMY state can be asserted which is permitted to freely propagate through ALK circuitry up to a corresponding MODE output [140] on which the DUMMY state eventually shows up. ALK is such that this propagation of the DUMMY state occurs regardless of the logic levels present on the set of LOGIC inputs [110]. Whenever MODE input and MODE output are in the DUMMY state new levels on the LOGIC inputs are asserted, upon request, from other logic blocks interfacing ALK. Although the level changes on the LOGIC inputs condition differently ALK internal circuitry, this cannot trigger any change on the MODE output [140] nor on the LOGIC outputs [120]. Alternatively, a VALID state can be asserted on the MODE input [130] which in turn triggers the propagation of a VALID state up to the MODE output [140] through ALK internal circuitry. On contrary of the DUMMY state, which ignored the levels present on the LOGIC inputs [110], a VALID state takes into consideration them so that the levels of LOGIC outputs [120] are reflecting the result of the particular logic function performed by ALK on the set of levels present on the LOGIC inputs [110] that are assumed to be stable while VALID state propagates. Whenever MODE input and MODE output are in a VALID state the result of the logic function carried out by ALK and present on the LOGIC outputs [120] are validated so they become useable by the other logic blocks to which ALK interfaces. This is summarized in table [150] which shows the two herein above states DUMMY and VALID as they appear at MODE input and MODE output of ALK.

Figure 2A:
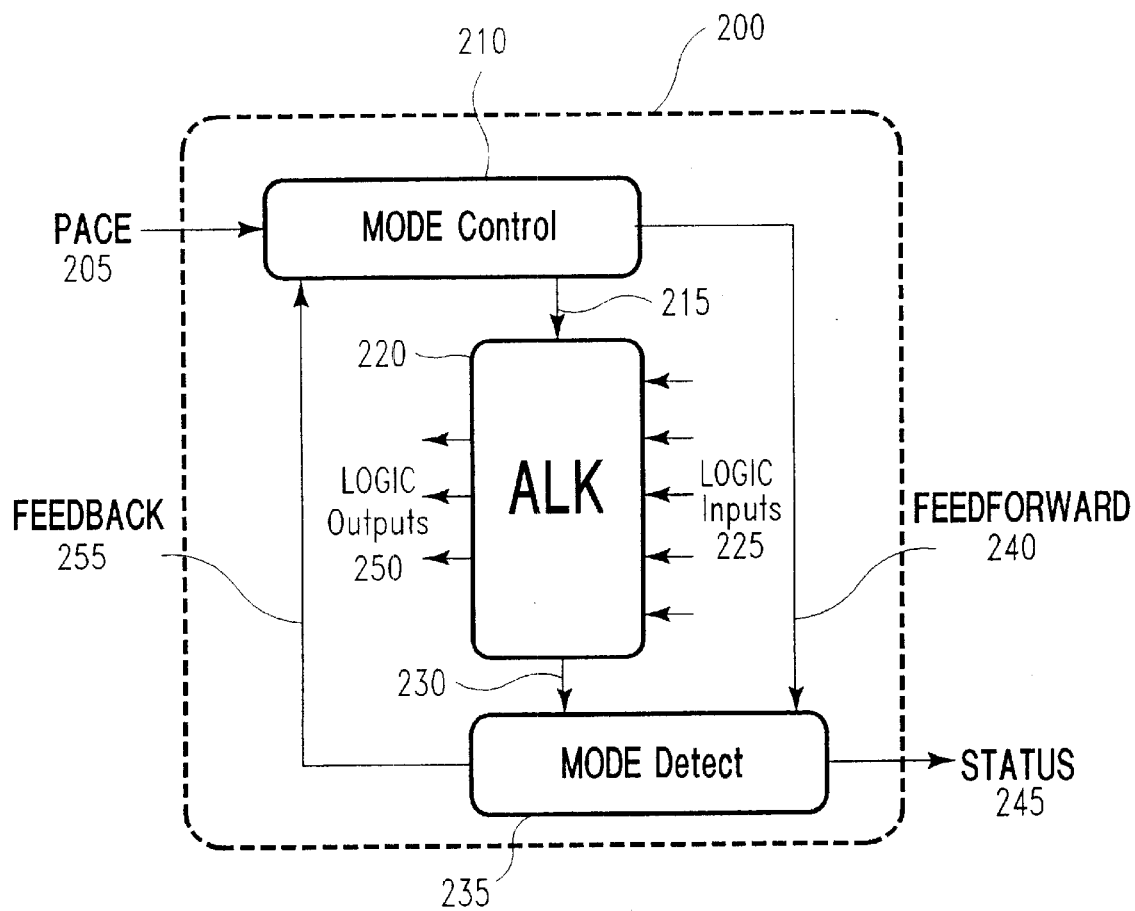
FIG. 2 is a high level description of an Autonomous Logic Circuit (ALC) built around an Autonomous Logic Kernel (ALK).
Figure 2B:
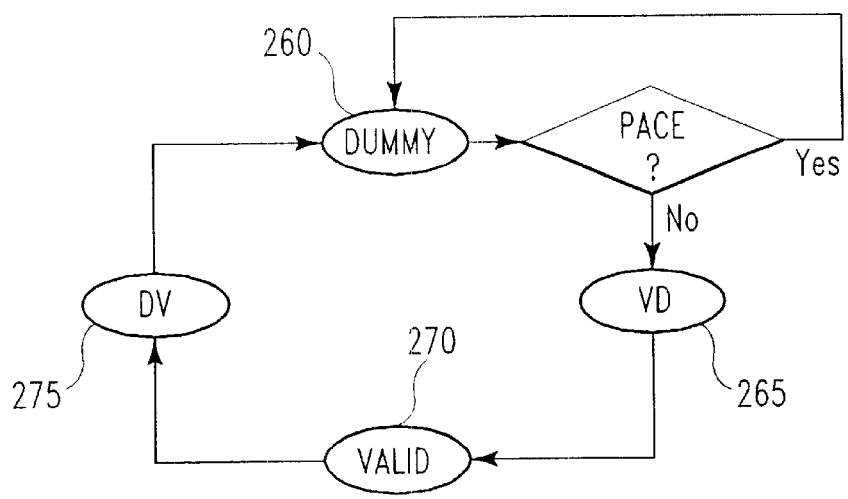

FIG. 2 illustrates how ALK is used to form an Autonomous Logic Circuit [200] that continuously oscillates between the VALID and DUMMY states previously described. Whenever the PACE control line [205] is no longer asserted a VALID state is immediately applied by the MODE Control circuit [210] to the MODE input [215] of ALK [220]. The VALID state is then allowed to propagate through ALK, evaluating the LOGIC inputs [225], up to the MODE output [230] of ALK used by the MODE Detect circuit [235] which, along with the Feedforward signal [240] delivers a STATUS [245] to the other logic blocks interfacing ALC so as they know when the LOGIC outputs [250] are valid and when new LOGIC inputs [225] need to be supplied. As soon as MODE Detect circuitry [235] decodes that a VALID state is present on the MODE input and MODE output of ALK [220] the Feedback signal [255] is asserted informing MODE control [210] to turn the MODE input [215] to the DUMMY state which in turn propagates to the MODE output [230] regardless of the logic levels on LOGIC inputs [225] thus forming a loop continuously toggling between two modes:

Ÿ A first one DUMMY [260] where a DUMMY state is present at both MODE input and MODE output of ALK [220] and during which new inputs to condition logic are accepted.

Ÿ A second one VALID [270] where a VALID state is found at both MODE input and MODE output of ALK so LOGIC inputs [225] have been evaluated and valid levels are present on the LOGIC outputs [250].

Through two transition states:

Ÿ DV [275] and VD [265] whenever ALC is switching from one mode to another.

If needed ALC may be forced into DUMMY mode [260] as long as necessary, e.g., to wait for valid LOGIC inputs, by asserting the PACE control input line [205].

Figure 3:
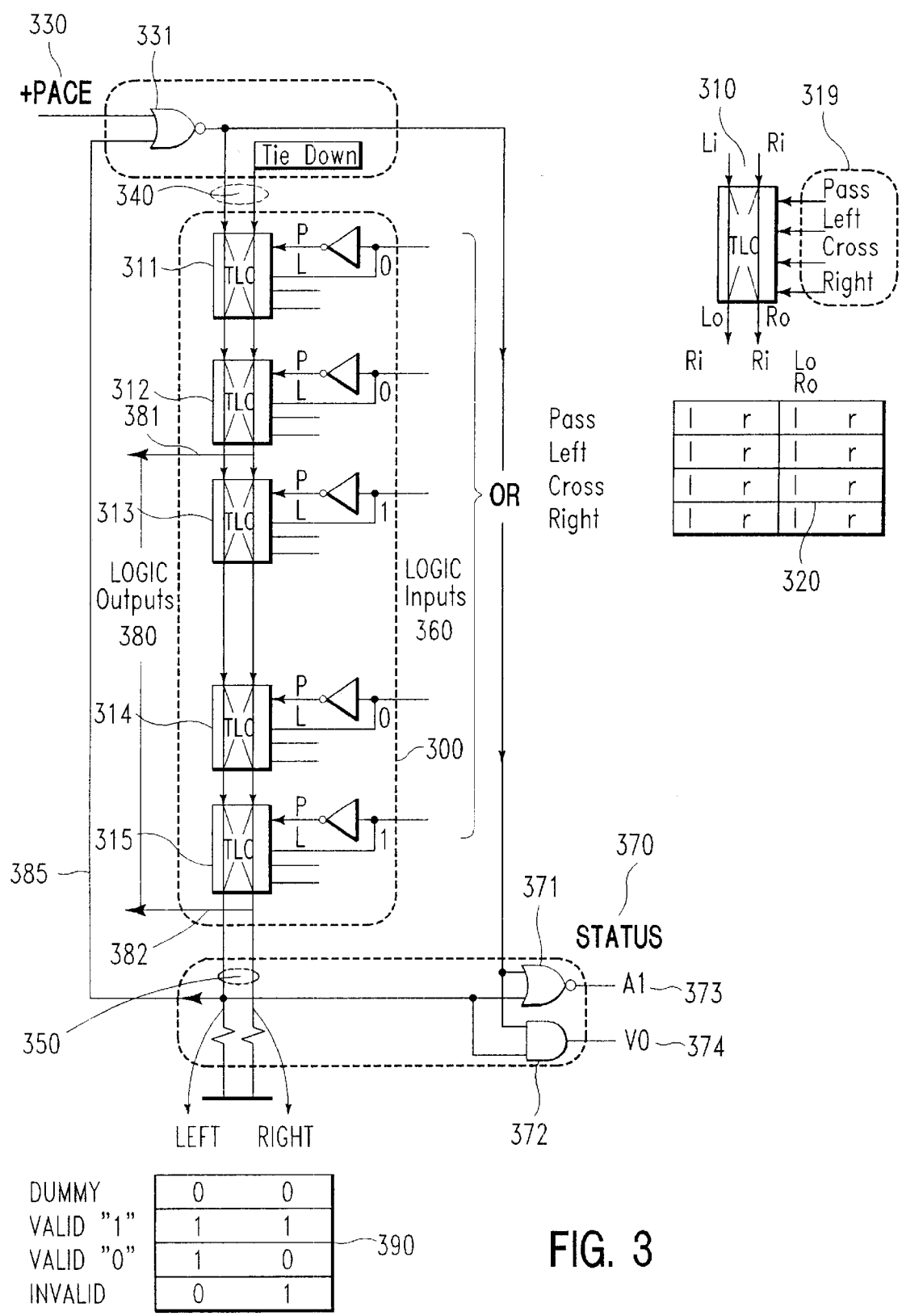
FIG. 3 shows, as an example, a simple particular implementation of an ALC complying with Autonomous Logic principles and made of Transfer Logic Cells (TLC's).

FIG. 3 is an elementary example of an ALC implementing an OR logic function so as to illustrate the principles of operation of autonomous logic. The logic kernel [300] uses preferably Transfer Logic Cells [310] referred to as TLC in the following description. TLC is the object of the European patent application 98480080-5 (IBM reference fr998047) entitled "Circuit and method for implementing combinatorial logic functions" incorporated herewith by reference. TLC has four non-boolean logic modes of operation, summarized in table [320], effected between a dual-rail input and a dual-rail output. Namely, a 'ASS' mode in which the information present on the dual rail input is transferred, unaffected, to the dual-rail output, a 'LEFT' mode in which the information present on the left rail of the input is duplicated onto the dual-rail output, a 'CROSS' mode in which the information present on the dual rail input is swapped onto the dual rail-output and a 'RIGHT' mode of operation in which the information present on the right rail of the input is duplicated onto the dual rail output. TLC's are cascade-able and form, in this particular example, a wide OR operator utilizing only two of the herein above logic modes of operations, i.e., the PASS and LEFT logic modes. Whenever the PACE line [330] is asserted a DUMMY state {0,0} is set on the dual-rail input [340] of the top TLC [311] acting as the MODE input [215] previously described in FIG. 2. Thus, as required by ALC principles the DUMMY state {0,0} propagates up to the dual-rail output [350] of the bottom TLC [315] playing the role of the MODE output [230] described in the previous FIG. 2. This propagation of the DUMMY state indeed occurs regardless of the levels present on the LOGIC inputs [360] since, whatever path is set, a zero logic is propagating. Then, whenever DUMMY state is present on both MODE input and MODE output of the kernel [300] this is decoded by the NOR gate [371] enabling the 'Assert Input'(AI) line [373], part of the STATUS [370], necessary to inform the interfacing logic that ALC LOGIC inputs [360] may be updated. When the PACE line [330] is de-asserted a VALID state {1,0} is applied to the MODE input [340] of the kernel. Because LOGIC inputs are set, paths are enabled within TLC's permitting to the VALID state to propagate. Because, in this particular example, a "1" is present on the LEFT terminal of TLC [313] a VALID state {1,1} is propagated from that point up to the MODE output [350] acknowledging the fact that an up level on any input of a logic OR turns its output on. Then, as soon as a VALID state is decoded at both ends [340] and [350] of the ALC kernel [300] by the AND gate [372] the 'Valid Outputs' (VO) line [374], part of the STATUS [370], is activated indicating to the logic blocks interfacing ALC that new LOGIC outputs [380] are available. In the particular example of FIG. 3 there are two outputs. A first one [381] is the partial OR of the two top LOGIC inputs while the result of the OR function on all the inputs is present on the right output of the bottom TLC [382]. As a consequence of the occurrence of a valid state on the MODE output [350] the Feedback line [385] becomes active which sets again, through the NOR gate [331] a DUMMY state {0,0} onto the MODE input [340] so as the whole sequence of events, herein above described, repeats. Thus, ALC is constantly toggling from VALID to DUMMY and vice-versa. While in a DUMMY mode new inputs are accepted and outputs, result of the logic function carried out by the ALC on the new set of inputs are validated so as they can be used by the interfacing logic while ALC is in a VALID mode.

Figure 7:
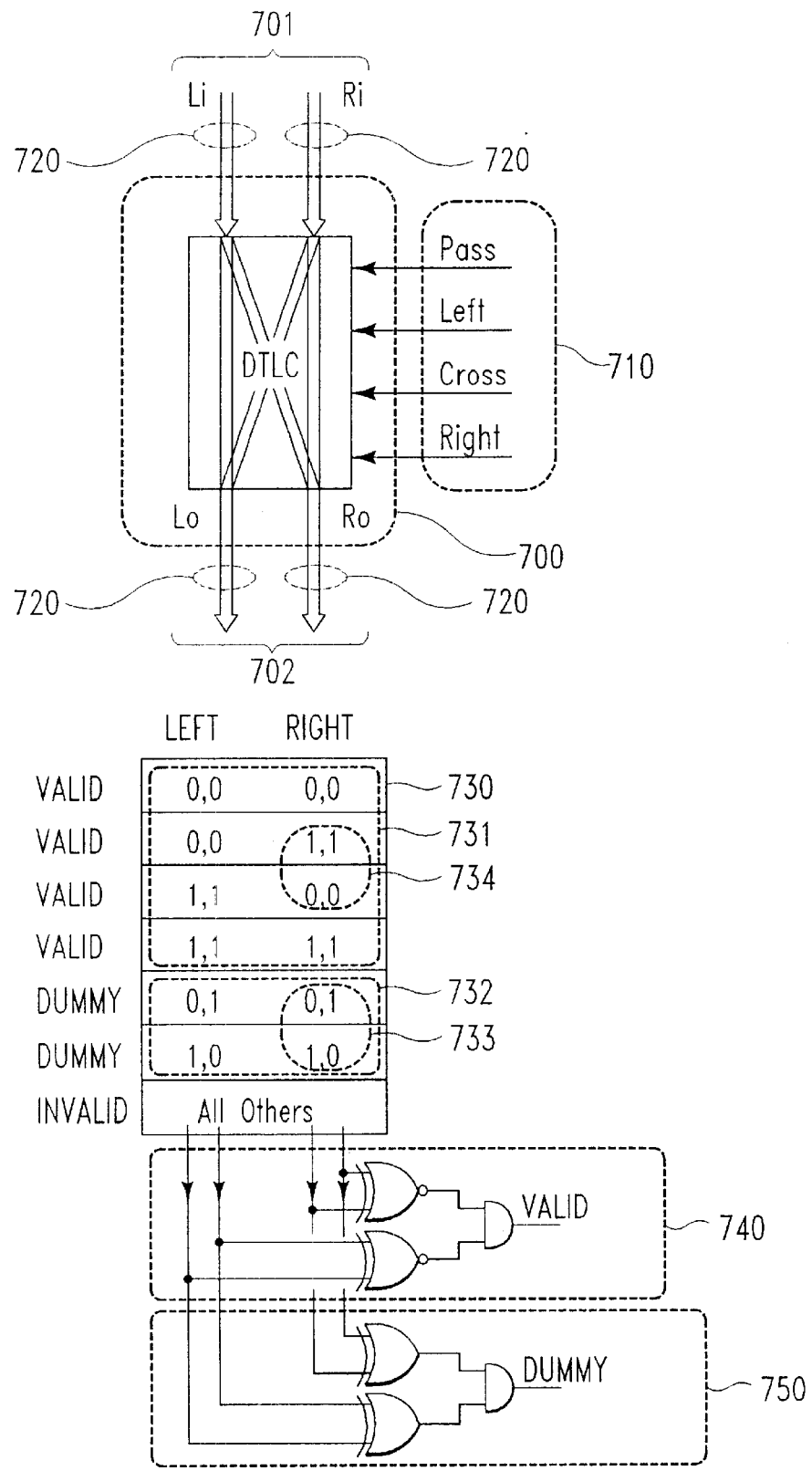
FIG. 7 describes the Double Transfer Logic Cell to be used as a glitch-less building block for constructing ALK's.

It is worth noting here that the particular states carried on the dual-rail input of the TLC's forming the kernel of ALC are chosen so that a glitchless operation is possible. States used are shown in [390]. The DUMMY state is {0,0} so that when applied at MODE input it propagates through TLC's regardless of the logic present on the control terminals [319]. Then, there are two valid states, i.e., {1,0} and {1,1} to indicate the binary result of the logic function applied on the set of inputs. Because the two valid states have a "1" in common on the left rail, only this line needs to be observed to determine in which mode ALC is operating and acted on to toggle the circuit thus, preventing any glitch to occur that would be otherwise very detrimental to a safe operation of ALC. If, because propagation delays on the two rails are slightly different, the INVALID state {0,1} shows up for a short period of time on the MODE output [350] it cannot have any undesirable effect. However, a more general solution to a glitch-free functioning of ALC is depicted in FIG. 7.

Figure 4:
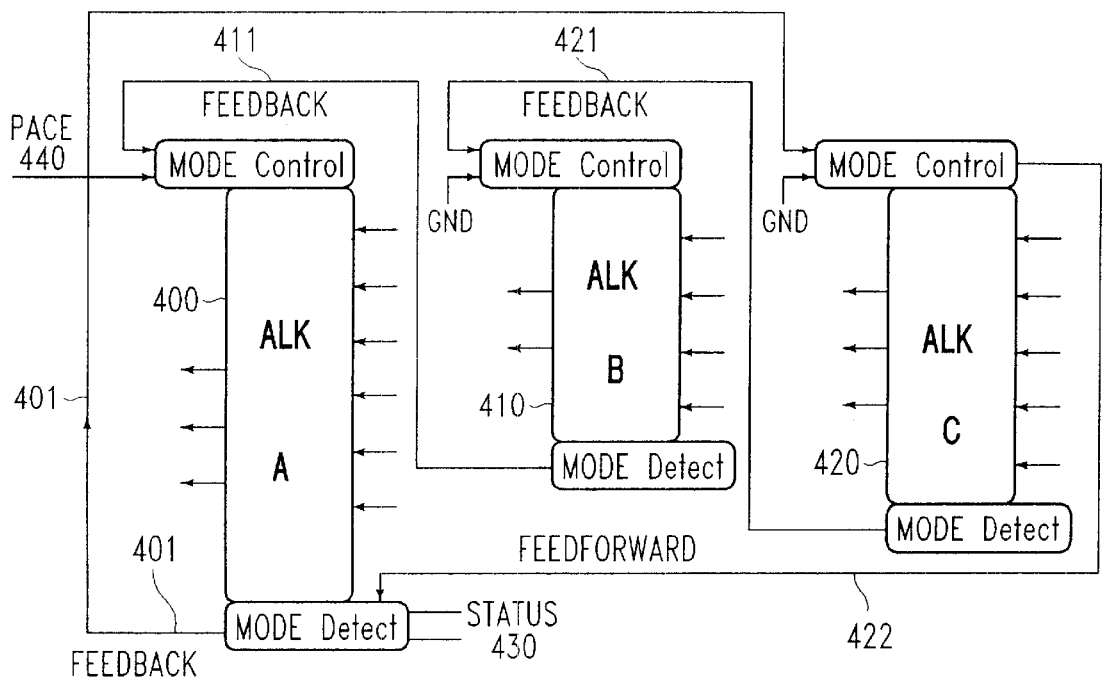
FIG. 4 is an example of serially combined ALC's.

FIG. 4 depicts one way of combining ALC's that need to work together at the same pace. In this example three kernels [400], [410] and [420], implementing different logic functions, are serially interconnected through their Feedback lines [401], [411] and [421] along with the Feedforward line [422] of the most right block to form a single piece of logic operating in synchronism. Then, the times at which LOGIC outputs are ready to be used and new LOGIC inputs need to be asserted are the same and indicated by the STATUS lines [430]. A single PACE line [440] may force all ALC's in a DUMMY mode, the unused ones being inactivated. The speed of operation in a serial configuration of ALC's is dependent on the time taken by the VALID and DUMMY states to propagate successively through all ALC's.

Figure 5:
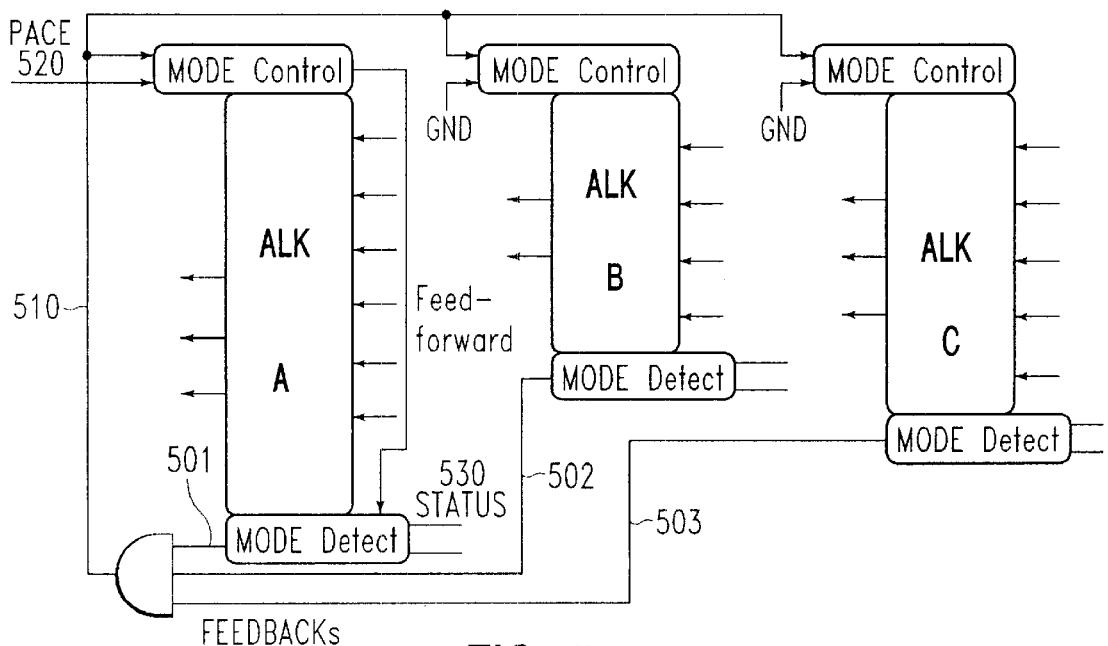
FIG. 5 is an example of a parallel combination of ALC's.

FIG. 5 depicts an alternate way of combining ALC's so that they work in synchronism too. In this case the Feedback lines [501], [502] and [503] are ANDed so as a unique FEEDBACK [510] is returned to the MODE Control input of each ALC. Therefore, the slowest ALC of the group sets the speed at which the group may oscillate. A single PACE line, e.g., [520] needs to be activated to force the group to stay in the DUMMY mode since the common Feedback [510] cannot become active until all individual Feedbacks are active. As opposed to the previous serial way of combining ALC's this one is referred to as being a parallel combination of ALC's. The times at which LOGIC outputs are ready and LOGIC inputs need to be asserted should be derived from the STATUS of the slowest ALC, e.g., [530] in the particular example of FIG. 5. However, if no ALC can be pinpointed as being the slowest one in a group then, all STATUS lines must be ANDed in order that the slowest one is automatically selected so interfacing logic knows when to deliver new input values to the group of ALC's or use new output values from it.

Figure 6:
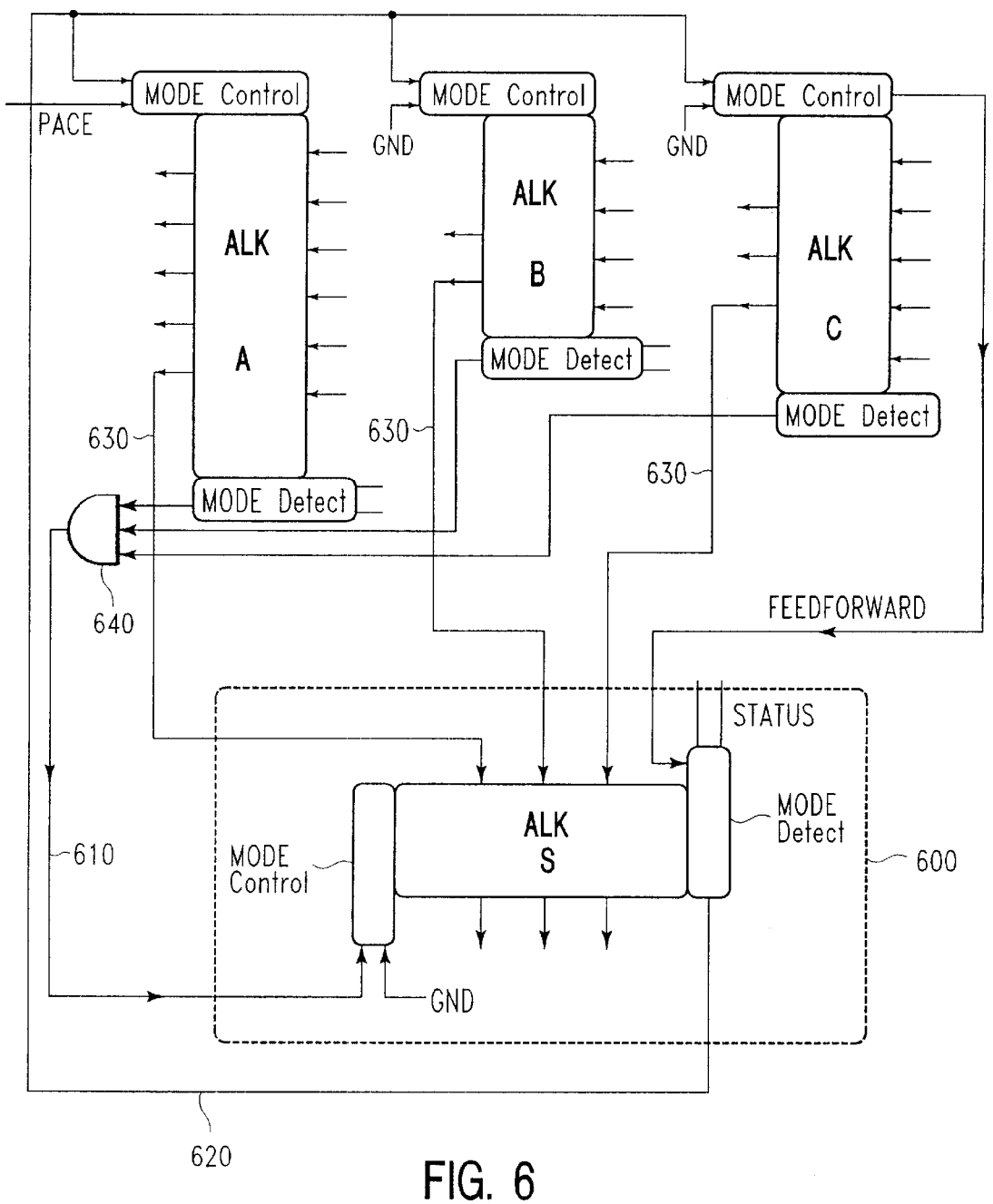
FIG. 6 is a further example of parallel/serial combination of ALC's.

FIG. 6 is an example of how serial and parallel modes described in FIGS. 4 and 5 respectively can be further combined to form larger ALC logic structures operating in synchronism. This example combines the parallel combination of the three ALC's denominated A, B and C of previous FIG. 5 now serially connected with a fourth ALC [600] denominated S. Thus, Feedback [610] is now connected to MODE control of ALC [600] and this is Feedback [620], coming out from ALC [600], which is sent instead to the parallel arrangement of the three ALC's A, B and C. Therefore, this parallel/serial arrangement of ALC's operates at a frequency that depends on the propagation delay of the slowest ALC within the parallel group incremented of the delay of the serially connected ALC [600]. FIG. 6 also displays logic interconnections [630] between ALK's that are representative of the way more complex logic functions are realized between ALC's pertaining to the same arrangement, i.e., operating in synchronism. In the particular arrangement of FIG. 6 the three top ALC's A, B and C could implement each, e.g., an AND function, outputs of which are brought to the inputs of ALC [600] which could implement, e.g., an OR function so as to form a standard AND/OR logic combination. Hence, it should be obvious to the person skilled in the art that any parallel/serial combination of ALC derived from the examples of previous FIGS. 4, 5 and 6 is theoretically possible. However, in each case, the delay of the feedback longest path sets the speed at which the group of ALC's operates which must stay compatible with the upper speed at which a logic is due to work to fulfill a particular user application. It must also be pointed out that further refinements could be considered in the elaboration of the feedback paths. Although FIGS. 4, 5 and 6 implicitly assume, for the sake of simplicity, that the longest feedback path is always used to set the speed of a group it is easily conceivable, by the person skilled in the art, that some more elaborated schemes are possible to control the speed of a group of ALC's working in synchronism. In the example mentioned herein above of an AND/OR logic function it is sufficient that a logic "1" be present on the output of any of the ALC denominated A, B or C of FIG. 6 to authorize the feedback to further propagate to the ALC [600] rather than the simple AND logic [640] shown in this example. Therefore, the group is able to self-adapt its speed to the particular combination of logic levels present at any moment on its logic inputs. This further enhances the intrinsic capability of ALC's to work at their 'natural' speed, i.e., always reflecting the current environmental conditions such as temperature and power supply along with the actual performances inherited from the physical process characteristics of a particular fabrication lot. Finally, mention must also be made here that ALC and group of ALC's working in synchronism, do not have to oscillate permanently. If no new inputs are available or if the particular function carried out by a group of ALC's, for example an adder, is not temporarily required the PACE line should be activated by the controlling logic so as to keep the logic function quiet in a DUMMY state thus, preventing it from dissipating power. Moreover, standard techniques, well known by the person skilled in the art, can be further applied using STATUS and PACE lines to operate any group of synchronous ALC's in a single-shot mode where such group is activated only once per new set of inputs.

FIG. 7 describes the Double Transfer Logic Cell or DTLC [700] aimed at allowing a glitch-less functioning of ALC's. DTLC is not different of TLC as far as the modes of operation are concerned. It permits to implement all the logic and non-logic modes of operation especially the four logic modes 'Pass', 'Left', 'Cross' and 'Right' enabled through the assertion of the control terminals [710] and performing the operations described in table [320] of FIG. 3 between the dual-rail input [701] and the dual-rail output [702] of a TLC or of a DTLC. However, each rail of a DTLC is in turn a double-line [720]. As a consequence the levels to differentiate between the VALID states [731] and DUMMY states [732] may be chosen as described in table [730]. In this approach, on contrary of what was described in FIG. 2 that assumes the use of a simpler single-line rail TLC, the four logic levels [731] are possibly useable thus, giving more freedom to implement logic functions. The two possible DUMMY levels [732] are such that the double line of each rail is encoded with levels of opposite polarities, i.e., '0,1' or '1,0' [733] while '0,0' and '1,1' [734] are reserved for the VALID levels [731]. All the other combinations are invalid and, if briefly observed due to unbalanced propagation delays, they cannot disturb ALC functioning. Therefore, when going from VALID to DUMMY and vice-versa each double line is self carrying the information that it is part of a VALID or DUMMY state. Moreover, there is only one line of a dual-line rail that is changing at a time whenever switching from one mode to another one occurs insuring a glitchless operation on each individual rail. DUMMY states [732] are such that right and left rails are equal so that they propagate within a chain of DTLC's regardless of the logic levels present on the control terminals [710] so as to obey ALC principles. Finally, decode of DUMMY and VALID states is generic whichever logic is implemented within the kernel of ALC. Namely, a VALID state is when the same level is found on both lines of a rail and that is true on both left and right rails of a DTLC as shown in [740]. A DUMMY state is when opposite levels are found between the two lines of a rail on both left and right rails [750]. All other combinations being temporary invalid states that are ignored. Finally, it is worth noting that nor TLC neither DTLC are consuming power by themselves since their individual use do not necessarily infer any direct connection to a power supply source. Then, when using pure electronic devices such as transistors, the power dissipated results from the charge and discharge of the parasitic capacitors associated to them or, more generally speaking, to the active devices necessary to carry out TLC and DTLC functions, and from the wiring to cascade them so as to implement a particular logic function as it was shown, for example, in FIG. 3. This power is eventually borrowed from the power supply either through a direct connection of a TLC or DTLC to a power terminal or through a logic gate like [331] in the example of FIG. 3.

Figure 8:
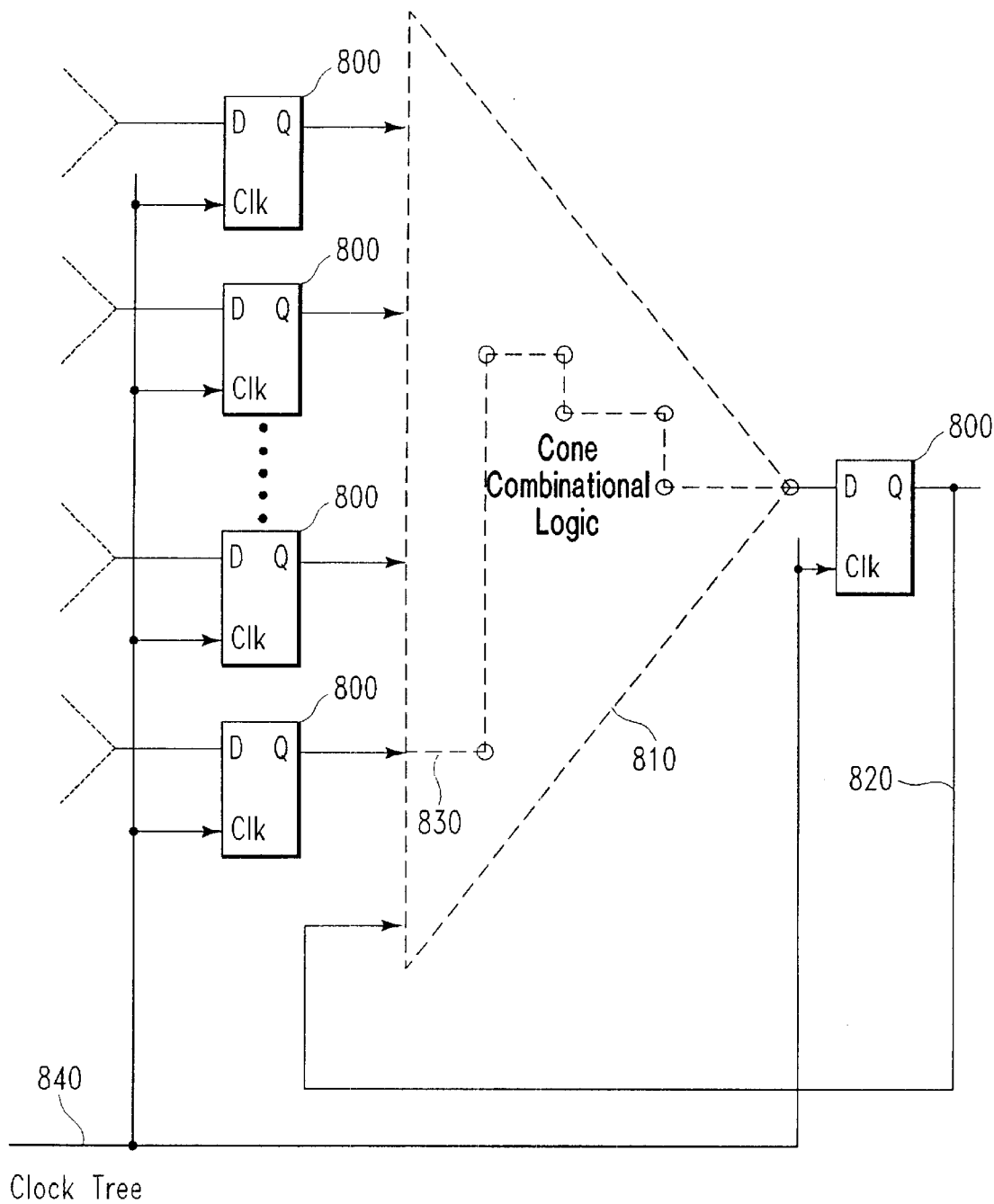
FIG. 8 illustrates how logic is implemented per the prior art.

FIG. 8 illustrates how logic functions are implemented per the prior art. Cones of combinational logic [810] are inserted between latches [800], all fed from the same timing source or clock thus, forming a clock tree [840] aimed at delivering a precise timing reference to every latch [800]. Cone inputs are possibly driven from any latch output including the self feeding case [820]. Within every cone there is a longest delay path [830]. The worst of all paths sets the speed at which the whole logic function may possibly be run.

The herein above description of the preferred embodiment of the invention has been presented for the purposes of illustration and description. It is not intended to be exhaustive or to limit the present invention to the precise form disclosed. Many variations and modifications, obvious to the person skilled in the art, are possible in light of the above teachings and are intended to be incorporated herein after.

What is claimed is:

1. A logic circuit, operable in a DUMMY mode and in a VALID mode, said circuit comprising:
   at least one LOGIC input line, each of said LOGIC input line having an asserted state and a de-asserted state;
   at least one LOGIC output line, each of said LOGIC output line having an asserted state and a de-asserted state;
   at least one MODE input line, for turning said logic circuit into said DUMMY mode or said VALID mode;
   at least one MODE output line, for detecting whether said logic circuit is operating in said DUMMY mode or in said VALID mode;
   means for performing logic operations between said LOGIC input lines and said LOGIC output lines when said VALID mode is active;
   means for propagating said DUMMY mode throughout said logic circuit [100].

2. The logic circuit of claim 1 further comprising a means for selecting a mode for said logic circuit turning said logic circuit said modes selected from the group consisting of said VALID mode or into said DUMMY mode, said controlling means comprising an input means for a PACE signal [205] capable of selecting said dummy mode for said logic circuit when asserted;
   an input means for a FEEDBACK signal [255] for toggling between said VALID mode and said DUMMY mode when said PACE signal is not asserted;
   an output means for a FEEDFORWARD signal [240] for reporting if said controlling means [210] is asserting said VALID mode or said DUMMY mode.

3. The logic circuit according to claim 2 further comprising:
   means for detecting when said logic circuit mode comprising:
   an input means for a FEEDFORWARD signal [240] for monitoring whether said controlling means [210] mode;
   an output means for a FEEDBACK signal [255] for reporting said detecting means [235] functioning;
   a STATUS means [245] for generating a first signal for requesting the assertion of new states on said LOGIC inputs and a second signal for indicating that new states are ready to be used on said LOGIC outputs.

4. A method according to claim 3 further comprising the steps of:
   connecting [401] a FEEDBACK output of said detecting means [235] of the first [400] of the plurality of logic circuits to the FEEDBACK input of said controlling means [210] of the last [420] of said plurality of logic circuits;
   connecting [411] [421] the FEEDBACK output of each of said detecting means [235] starting from the last [420] of said plurality of logic circuits to the FEEDBACK input of said controlling means [210] of a next [410] of said plurality of logic circuits up to the first [400] of said plurality of logic circuits;
   connecting [422] the FEEDFORWARD output of said controlling means [210] of the last [420] of said plurality of logic circuits to the FEEDFORWARD input of said detecting means [235] of the first [400] of said plurality of logic circuits.

5. A method according to claim 4 further comprising the steps of:
   performing a logical AND over all FEEDBACK output signals [501] [502] [503] of said detecting means [235] from all of said plurality of logic circuits;
   connecting [510] the result of said logical AND to the FEEDBACK input of said controlling means [210] to all of said plurality of logic circuits;
   using the STATUS means of the slowest logic circuit of said plurality of logic circuit as a common STATUS means.

6. The method of claim 5 wherein the common STATUS means is selected by performing a logical AND on the signals of all said STATUS means.

7. A method according to claim 3 comprising the steps of:
   defining VALID states [731] and DUMMY states [732] over two rails of a dual-rail logic device [700],
   encoding each of said two rails with a plurality of possible states;
   defining a plurality of VALID states [731] among said plurality of possible states, over the two rails;
   defining one or a plurality of DUMMY states [732] among said plurality of possible states, over the two rails;
   defining one or a plurality of VALID states [734] among said plurality of VALID states, over each said individual rail;
   defining one or a plurality of DUMMY states [733] among said plurality of DUMMY states, over each said individual rail;

decoding [740] any of said VALID states when the two rails are both in said VALID state; and decoding [750] any of said DUMMY states when the two rails are both in said DUMMY state.

8. A method according to claim 2 comprising the steps of:

defining VALID states [731] and DUMMY states [732] over two rails of a dual-rail logic device [700], encoding each of said two rails with a plurality of possible states;

defining a plurality of VALID states [731] among said plurality of possible states, over the two rails;

defining one or a plurality of DUMMY states [732] among said plurality of possible states, over the two rails;

defining one or a plurality of VALID states [734] among said plurality of VALID states, over each said individual rail;

defining one or a plurality of DUMMY states [733] among said plurality of DUMMY states, over each said individual rail;

decoding [740] any of said VALID states when the two rails are both in said VALID state; and decoding [750] any of said DUMMY states when the two rails are both in said DUMMY state.

9. A method according to claim 1 further comprising the steps of:

connecting [401] a FEEDBACK output of said detecting means [235] of the first [400] of the plurality of logic circuits to the FEEDBACK input of said controlling means [210] of the last [420] of said plurality of logic circuits;.

connecting [411] [421] the FEEDBACK output of each of said detecting means [235] starting from the last [420] of said plurality of logic circuits to the FEEDBACK input of said controlling means [210] of a next [410] of said plurality of logic circuits up to the first [400] of said plurality of logic circuits;

connecting [422] the FEEDFORWARD output of said controlling means [210] of the last [420] of said plurality of logic circuits to the FEEDFORWARD input of said detecting means [235] of the first [400] of said plurality of logic circuits.

10. A method according to claim 9 further comprising the steps of:

performing a logical AND over all FEEDBACK output signals [501] [502] [503] of said detecting means [235] from all of said plurality of logic circuits;

connecting [510] the result of said logical AND to the FEEDBACK input of said controlling means [210] to all of said plurality of logic circuits;

using the STATUS means of the slowest logic circuit of said plurality of logic circuit as a common STATUS means.

11. The method of claim 10 wherein the common STATUS means is selected by performing a logical AND on the signals of all said STATUS means.

12. The logic circuit according to claim 1 further comprising:

means for detecting when said logic circuit mode comprising:

an input means for a FEEDFORWARD signal [240] for monitoring whether said controlling means [210] mode;

an output means for a FEEDBACK signal [255] for reporting said detecting means [235] functioning;

a STATUS means [245] for generating a first signal for requesting the assertion of new states on said LOGIC inputs and a second signal for indicating that new states are ready to be used on said LOGIC outputs.

13. A method according to claim 12 further comprising the steps of:

connecting [401] a FEEDBACK output of said detecting means [235] of the first [400] of the plurality of logic circuits to the FEEDBACK input of said controlling means [210] of the last [420] of said plurality of logic circuits;

connecting [411] [421] the FEEDBACK output of each of said detecting means [235] starting from the last [420] of said plurality of logic circuits to the FEEDBACK input of said controlling means [210] of a next [410] of said plurality of logic circuits up to the first [400] of said plurality of logic circuits;

connecting [422] the FEEDFORWARD output of said controlling means [210] of the last [420] of said plurality of logic circuits to the FEEDFORWARD input of said detecting means [235] of the first [400] of said plurality of logic circuits.

14. A method according to claim 13 further comprising the steps of:

performing a logical AND over all FEEDBACK output signals [501] [502] [503] of said detecting means [235] from all of said plurality of logic circuits;

connecting [510] the result of said logical AND to the FEEDBACK input of said controlling means [210] to all of said plurality of logic circuits;

using the STATUS means of the slowest logic circuit of said plurality of logic circuit as a common STATUS means.

15. The method of claim 14 wherein the common STATUS means is selected by performing a logical AND on the signals of all said STATUS means.

16. A method according to claim 12 comprising the steps of:

defining VALID states [731] and DUMMY states [732] over two rails of a dual-rail logic device [700], encoding each of said two rails with a plurality of possible states;

defining a plurality of VALID states [731] among said plurality of possible states, over the two rails;

defining one or a plurality of DUMMY states [732] among said plurality of possible states, over the two rails;

defining one or a plurality of VALID states [734] among said plurality of VALID states, over each said individual rail;

defining one or a plurality of DUMMY states [733] among said plurality of DUMMY states, over each said individual rail;

decoding [740] any of said VALID states when the two rails are both in said VALID state; and decoding [750] any of said DUMMY states when the two rails are both in said DUMMY state.

* * * * *